United States Patent

Hui et al.

[54] METHOD AND SYSTEM FOR PROVIDING A CONTACT ON A SEMICONDUCTOR DEVICE

[75] Inventors: Angela T. Hui, Fremont; Hung-Sheng Chen, San Jose; Unsoon Kim, Santa Clara, all of Calif.

[73] Assignee: Advanced Micro Devices, Inc., Sunnyvale, Calif.

[21] Appl. No.: 09/023,836

[22] Filed: Feb. 13, 1998

[51] Int. Cl.[7] .............................. H01L 21/76; H01L 21/44
[52] U.S. Cl. ..................... 438/427; 438/597; 438/634; 438/970
[58] Field of Search .................................. 438/427, 634, 438/702, 703, 970, 597

[11] Patent Number: 6,103,593
[45] Date of Patent: Aug. 15, 2000

[56] References Cited

U.S. PATENT DOCUMENTS

| | | | |
|---|---|---|---|
| 5,702,981 | 12/1997 | Maniar et al. | 438/702 |
| 5,766,974 | 6/1998 | Sardella et al. | 438/634 |
| 5,888,887 | 3/1999 | Li et al. | 438/525 |
| 5,910,020 | 6/1999 | Yamada | 438/634 |
| 5,960,304 | 9/1999 | McAnally et al. | 438/597 |

OTHER PUBLICATIONS

Stanley Wolf Silicon Processing for the VSLI Era vol. 2 Lattice Press p. 52, 1990.

*Primary Examiner*—Charles Bowers
*Assistant Examiner*—David S Blum
*Attorney, Agent, or Firm*—Sawyer Law Group LLP

[57] ABSTRACT

A method for providing at least one contact on a semiconductor is disclosed. The semiconductor includes a plurality of isolation structures. The method and system include providing an etch-stop layer in direct contact with the semiconductor, providing a dielectric layer over the etch-stop layer, and etching through the dielectric layer and a portion of the etch-stop layer. A portion of the semiconductor in proximity with one of the plurality of isolation structures is not exposed during the etch.

25 Claims, 7 Drawing Sheets

FIG. 6D

METHOD AND SYSTEM FOR PROVIDING A CONTACT ON A SEMICONDUCTOR DEVICE

FIELD OF THE INVENTION

The present invention relates to semiconductor processing and more particularly to a method and system for providing a contact on a semiconductor device.

BACKGROUND OF THE INVENTION

High performance high density semiconductor devices include devices with increasingly finer geometries. Accordingly, methods of fabricating these devices with small geometries (for example, in the sub-0.5 µm range), must yield to exacting standards for handling minute tolerances associated with these small geometries. In fabricating semiconductor devices with such small feature dimensions, isolation between distinct regions of the devices must be maintained while achieving connectivity to selected regions of the device.

One conventional method for isolating semiconductor devices is local oxidation of silicon ("LOCOS"). In this process, the active regions of different semiconductor devices are isolated by thermally growing thick field oxide regions therebetween. However, the field oxide regions grown using LOCOS have sloped ends, forming a relatively large "bird's beak" at each end of the field oxide region. Because of the large "bird's beak" of the field oxide regions, an isolation structure formed using LOCOS may not be scaled to lower devices sizes. Thus, LOCOS is unsuitable for semiconductor devices having a smaller feature size.

Shallow trench isolation ("STI") is a conventional alternative to LOCOS for semiconductor devices having a smaller feature size. To form an STI isolation structure, a trench is etched in a semiconductor substrate. The trench has substantially vertical sidewalls. A dielectric such as tetra-ethylortho silicate (TEOS) is then deposited. The dielectric fills the trench, forming the STI isolation structure. Because the STI isolation structure is formed through an etch and dielectric deposition, the STI isolation can be scaled to semiconductor devices having smaller a feature size.

Once the isolation structures are formed either using LOCOS or STI, conventional semiconductor processing continues. Active regions are formed between the isolation structures. A dielectric layer is then provided. The dielectric layer covers the surface of the semiconductor devices, including the active regions and isolation structures. Electrical contact with the active regions is also made. Typically, contact holes are etched through the dielectric layer to the active surfaces. The contact holes are then filled with a conductor.

Semiconductor devices having isolation structures formed using either LOCOS or STI often suffer from misalignment of features such as contacts. In order to etch contact holes, a mask is provided on the dielectric layer. The mask may be misaligned. For example, a contact hole in the mask may lie above both an active region and an isolation structure. Moreover, the thickness of the dielectric layer varies across the surface of the semiconductor. To ensure that contact holes are provided regardless of the thickness of the dielectric layer, longer etch times are used. In areas where the dielectric layer is thinner, a portion of the isolation structure may be etched, exposing the semiconductor under the active region and adjacent to the isolation structure. When the contact hole is filled with the conductor, the conductor makes contact with both the active region and the underlying semiconductor. The active region and underlying semiconductor are shorted. Consequently, the semiconductor device may be inoperable.

For a semiconductor device having isolation structures formed using LOCOS, shorts due to contact misalignment are addressed using plug implants. Plug implants are used to dope the area of the underlying semiconductor at the edge of an isolation structure. When a misaligned contact hole is filled with the conductor, the conductor may reach the plug implant, but not the underlying semiconductor. Shorting between the underlying semiconductor and the active region is thereby prevented.

Although plug implants function for isolation structures formed using LOCOS, plug implants are inappropriate for isolation structures formed using STI. An STI isolation structure has substantially vertical sidewalls. Consequently, doping the underlying semiconductor at the edge of an STI isolation structure is virtually impossible.

Accordingly, what is needed is a method and system for reliably and consistently reducing problems due to misalignment of the contacts for a semiconductor device. Although applicable to many semiconductor devices, such a method and system would be particularly useful in semiconductor devices isolated using STI. It would also be beneficial if the method and system increase semiconductor devices fabrication throughput. The present invention addresses such needs.

SUMMARY OF THE INVENTION

The present invention provides a method and system for providing at least one contact on a semiconductor. The semiconductor includes a plurality of isolation structures. The method and system comprise providing an etch-stop layer in direct contact with the semiconductor, providing a dielectric layer over the etch-stop layer, and etching through the dielectric layer and a portion of the etch-stop layer. A portion of the semiconductor in proximity with one of the plurality of isolation structures is not exposed during the etch.

According to the method and system disclosed herein, the adverse effects of misalignment are reduced. For example, shorting between an active region and the underlying semiconductor is prevented.

DETAILED DESCRIPTION OF THE INVENTION

The present invention relates to a method and system for providing a contact on a semiconductor device. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention is described in terms of contacts formed over the semiconductor substrate. However, it can be appreciated that the present invention is also applicable to features other than contacts, and the implementation of features other than contacts would be within the spirit and scope of the present invention.

Semiconductor devices are increasingly driven to smaller device sizes. Methods of fabricating these devices with small feature sizes (for example, in the sub-0.5 $\mu$m range), are capable of providing features and separation of features in accordance with these small geometries. In fabricating semiconductor devices with such small feature dimensions, isolation between distinct regions of the devices must be maintained while achieving connectivity to selected regions of the device.

Figure 1A:
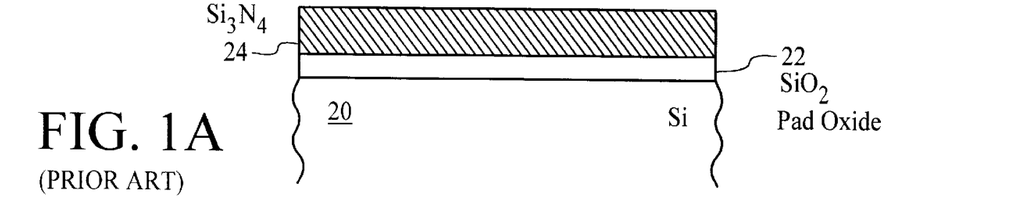
FIG. 1A illustrates shallow trench isolation structures prior to trench formation.
Figure 1B:
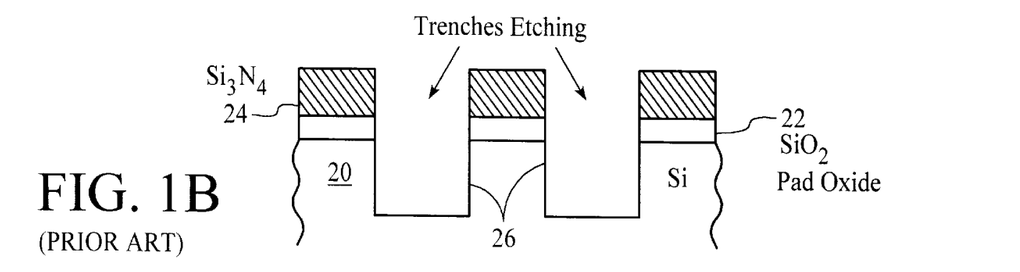
FIG. 1B illustrates shallow trench isolation structures after trench formation.
Figure 1C:
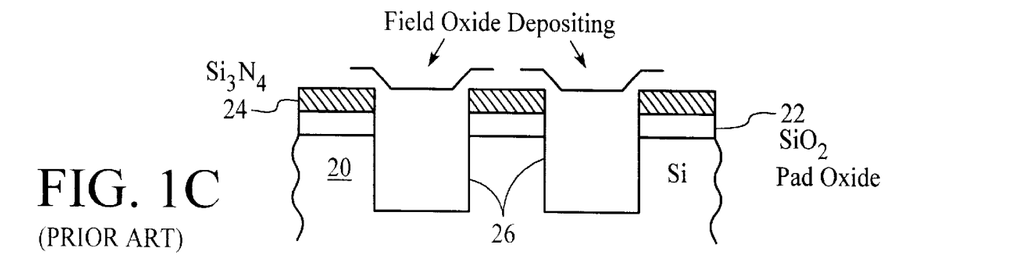
FIG. 1C illustrates shallow trench isolation structures after oxide deposition.
Figure 1D:
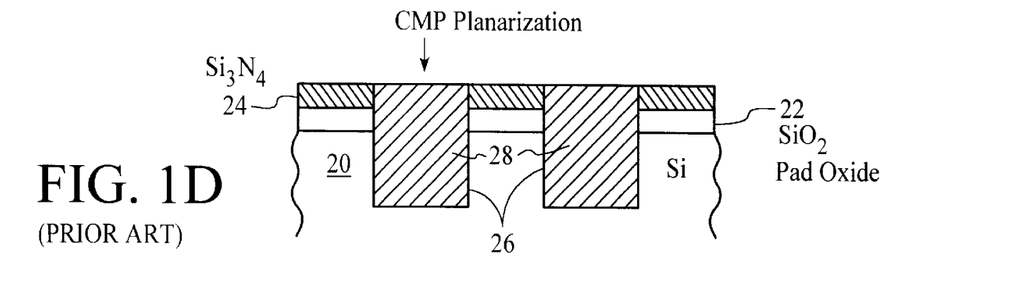
FIG. 1D illustrates shallow trench isolation structures after CMP planarization.
Figure 1E:
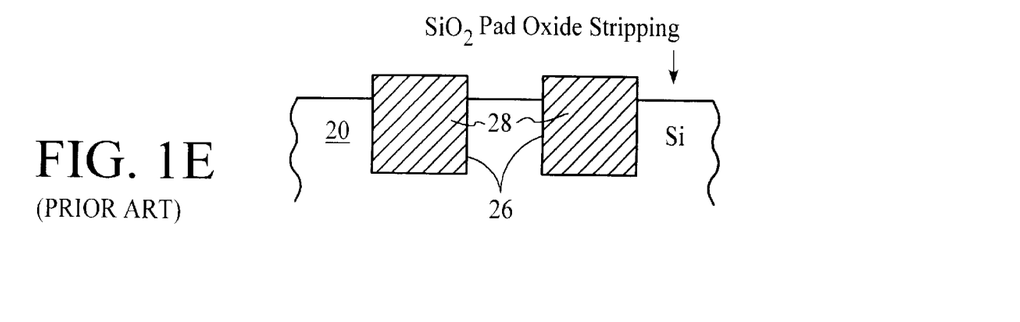
FIG. 1E illustrates shallow trench isolation structures after $Si_3N_4/SiO_2$ strip.

One conventional method for isolating semiconductor is shallow trench isolation ("STI"). FIGS. 1A through 1E depict steps in formation of a conventional STI isolation structures. FIG. 1A depicts the semiconductor 20 prior to trench formation. A thin oxide pad 22 and a thicker nitride layer 24 have been provided on the semiconductor 20. FIG. 1B depicts the semiconductor 20 after trench formation. The nitride layer 24, the oxide pad 22, and a portion of the semiconductor 20 have been etched, forming trenches 26. FIG. 1C depicts the semiconductor 20 after oxide deposition. After the trenches 26 have been formed, a layer of a dielectric material 28 is deposited. The dielectric material 28 fills the trenches 26. Typically, a dielectric such as tetraethylortho silicate ("TEOS") is used to fill the trenches 26. FIG. 1D depicts the semiconductor after the surface has been planarized. Typically, chemical mechanical planarization ("CMP") is used to planarize the surface. The nitride layer 24 acts as a CMP stop layer to reduce erosion of the underlying semiconductor 20 during planarization. FIG. 1E depicts the conventional STI isolation structures as completed. The nitride layer 24 and the oxide pad 22 have been stripped, leaving the trenches 26 filled with a dielectric 28.

Figure 2A:
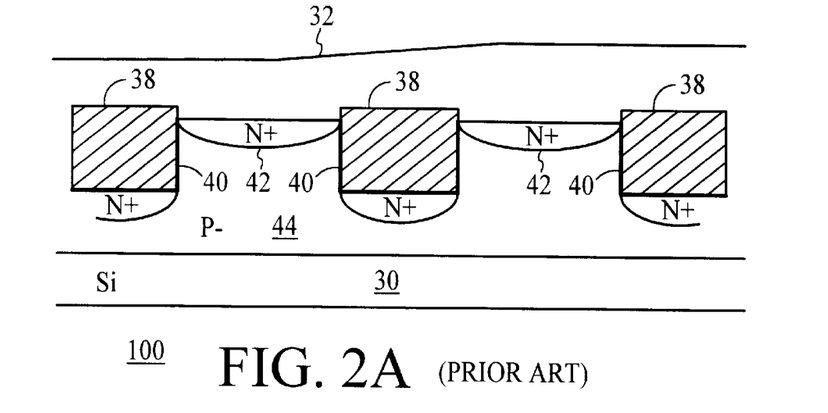
FIG. 2A is a diagram of a semiconductor device with a dielectric formed over a conventional STI isolation structure.

After formation of the STI isolation structures, conventional semiconductor processing continues. FIG. 2A depicts a conventional system 100 after some subsequent processing. Note that only certain portions of the conventional system 100 are depicted. The semiconductor 30 includes STI isolation structures 40 and a lightly doped region 44. Typically, the lightly doped region 44 is P doped. Active regions 42 have been implanted in the surface of the semiconductor 30. A dielectric layer 32 covers the surface of the system 100. Typically, the dielectric layer 32 is CVD oxides, such as borus phosphorus doped chemical vapor deposited (CVD) oxide ("BPSG"). The thickness of the dielectric layer 32 may vary widely across the surface of the semiconductor 30 due to the topology and non-uniformity. For example, the dielectric layer 32 typically varies between 5000 and 8000 Angstroms.

Figure 2B:
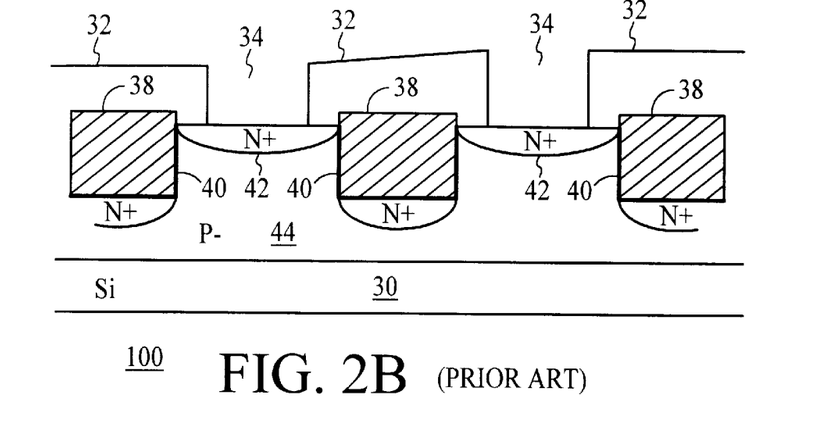
FIG. 2B is a diagram of the semiconductor device from FIG. 2A with the dielectric etched to form contact holes during the metal contacts formation process where the mask is aligned.

Electrical contact is desired to be made to the active regions 42. FIG. 2B depicts the system 100 after etching of contact holes 34 in the dielectric layer 32 where the mask defining the contact holes 34 was properly aligned. The contact holes 34 are disposed completely above the active regions 42. Consequently, no portion of the dielectric 38 in the STI isolation structures 40 is etched.

Figure 2C:
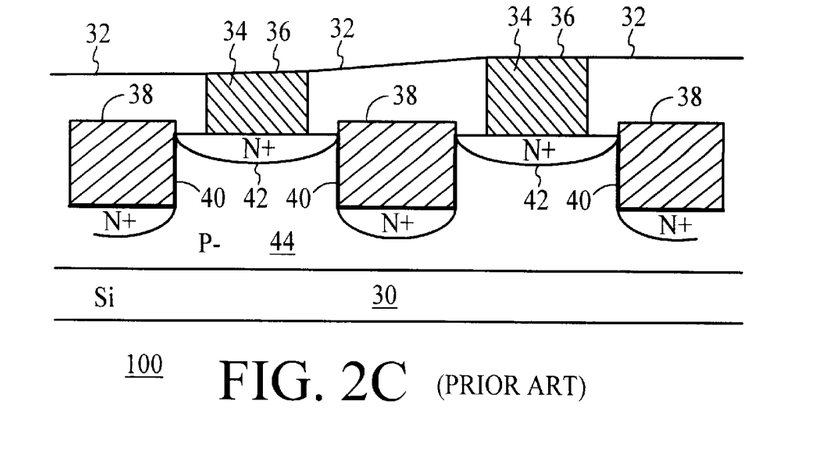
FIG. 2C is a diagram of the semiconductor device from FIG. 2B with the metal disposed in the contact holes during the metal contacts formation process where the mask is aligned.

FIG. 2C depicts the system 100 after filling of the contact holes 34. A metal 36 has been deposited in the contact holes 34. Thus, electrical contact is made to the active regions 42.

Although conventional semiconductor processing results in adequate contacts 36 being formed, one of ordinary skill in the art will readily understand that misalignment of the mask defining the contact holes 34 can degrade the performance of semiconductor devices.

Figure 2D:
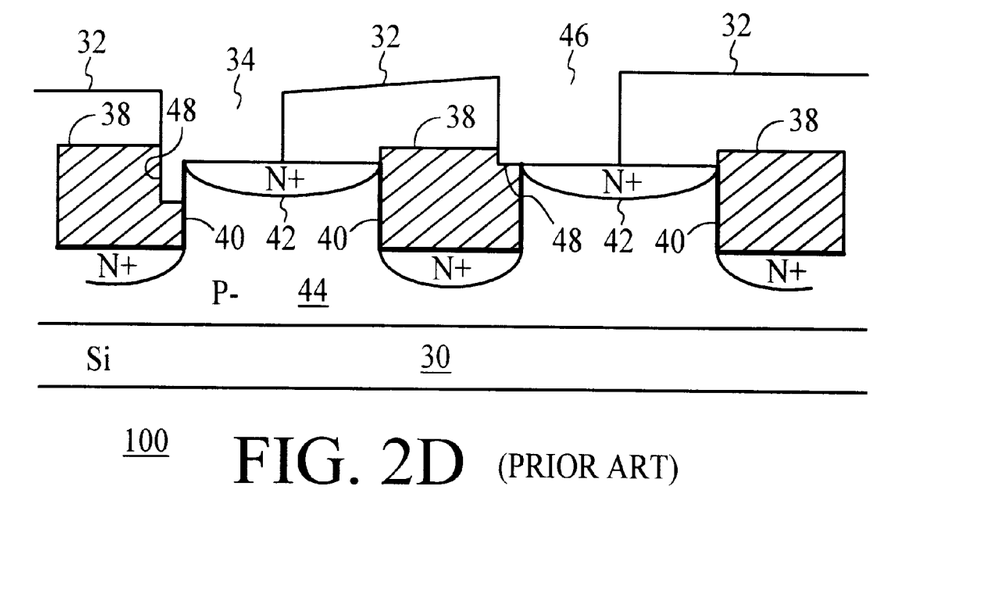
FIG. 2D is a diagram of the semiconductor device from FIG. 2A with the dielectric etched to form contact holes during the metal contacts formation process where the mask is misaligned.

FIG. 2D depicts the conventional system 100 after formation of contact holes where the mask defining the contact holes is misaligned. Because the mask was misaligned, a portion of the contact holes 34 and 46 in the dielectric layer 32 is above the dielectric 38 in the STI isolation structures 40. In addition, the portion of the dielectric layer 32 in which the contact hole 34 was formed is thinner than the portion of the dielectric layer 32 in which the contact hole 46 was formed.

Although the dielectric layer 32 varies in thickness, separate etches are not provided for contact holes in thinner portions of the dielectric layer 32. Instead, all contact holes are etched through the dielectric layer 32 to reach the underlying active regions 42 in a single step. Therefore, the etch used to form the contact holes 34 and 46 must be capable of etching through the thicker portion of the dielectric layer 32.

Where the dielectric is thicker, near contact hole 46, the oxide 38 in the STI isolation structure 40 is not substantially changed. However, where the dielectric layer is thinner, near contact hole 34, this etch also etches a portion of the system 100 under the dielectric layer 32. Therefore, the etch gouges a portion of the dielectric 38 of the STI isolation structure 40 under the contact hole 34. The edge 48 of the dielectric 38 recedes from the sidewall of the trench of the STI isolation structure 40. Consequently, a portion of the lightly doped portion 44 adjacent to the STI isolation structure 40 is exposed.

Figure 2E:
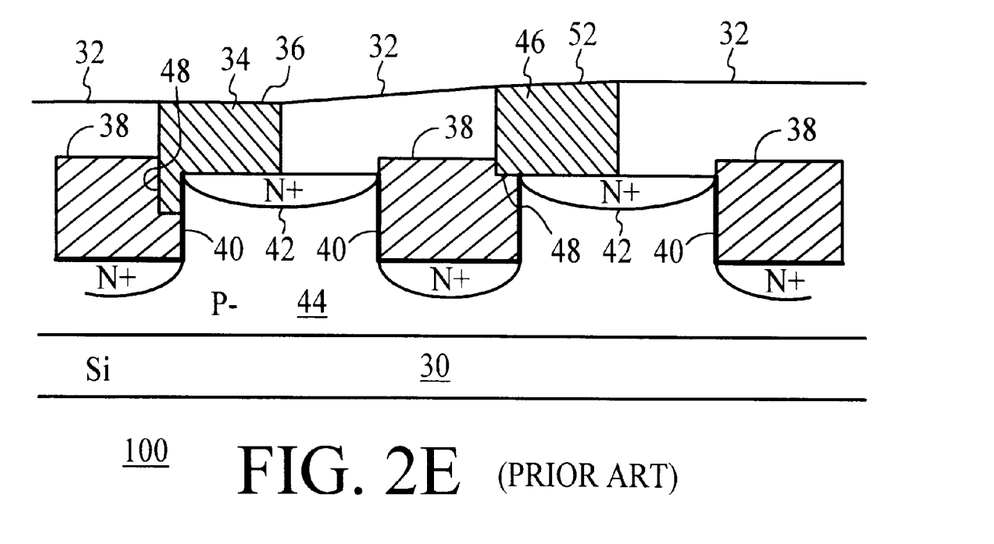
FIG. 2E is a diagram of the semiconductor device from FIG. 2D with the metal disposed in the contact holes during the metal contacts formation process where the mask is misaligned.

FIG. 2E depicts the system 100 after filling of the contact holes 34 and 46 where the mask defining the contact holes 34 and 46 is misaligned. Because the dielectric 38 in the STI isolation structure 40 near the contact hole 40 is not substantially damaged during the contact hole etch, the conductor 52 filling the contact hole 46 only touches the dielectric 38 and the active region 42.

However, the conductor 36 in the contact hole 34 contacts the dielectric 38, the active region 42, and a portion of the lightly doped substrate 44 under the contact hole 34. As a result, one active region 42 is shorted to the lightly doped substrate 44. The semiconductor device coupled with the contact hole 34 will, therefore, be inoperable.

Figure 3A:
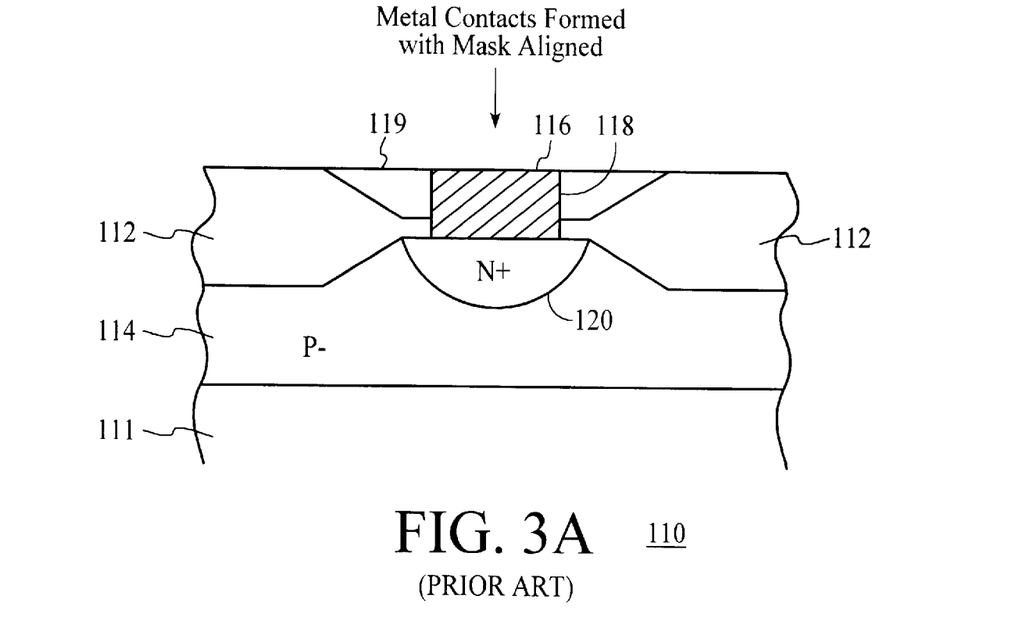
FIG. 3A is a diagram of a semiconductor device having a structure formed with conventional LOCOS after metal contacts are formed where the mask defining the contacts is aligned.

Semiconductor devices fabricated using conventional local oxidation of silicon ("LOCOS") also suffer from the effects of contact misalignment. FIG. 3A depicts a conventional semiconductor device 110 having isolation structures 112 formed using LOCOS where a mask defining the contact holes was properly aligned. A lightly doped region 114 exists on semiconductor 111. An active region 120 has been implanted in the lightly doped region 114. Isolation structures 112 separate the active region 120 from other active regions, not shown. A conductor 116 makes contact with the active region 120 through the contact hole 118 in dielectric layer 119.

Figure 3B:
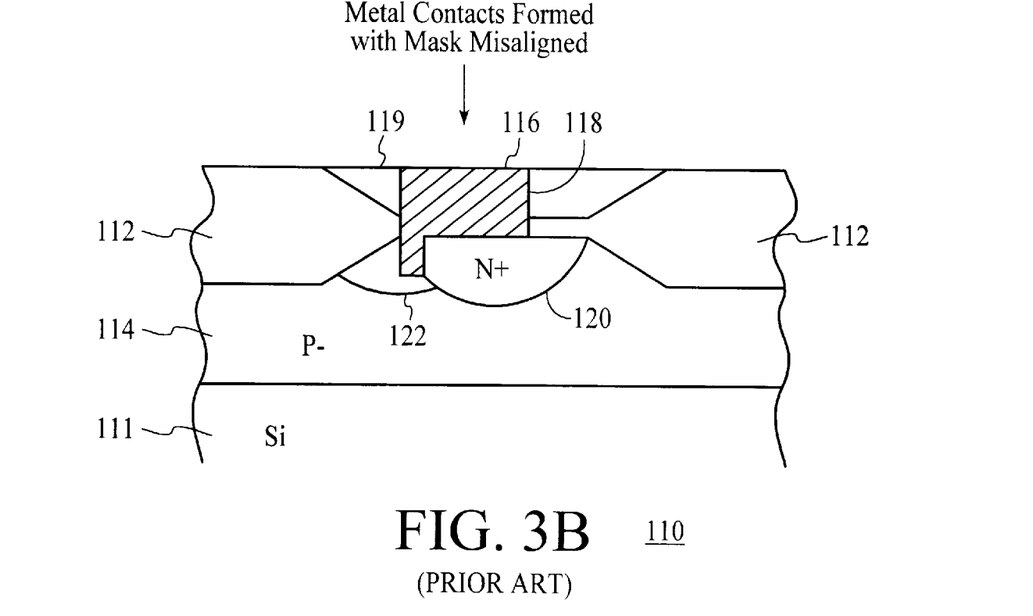
FIG. 3B is a diagram of a semiconductor device having a structure formed with conventional LOCOS after metal contacts are formed where the mask defining the contacts is misaligned.

FIG. 3B depicts a conventional semiconductor device 110 having isolation structures 112 formed using LOCOS where a mask defining the contact holes was misaligned. Similar structures are labeled as in FIG. 3A. Because of the misalignment and the relative thickness of the dielectric layer 119, etching the contact hole 118 also etched a portion of the isolation structure 112.

The semiconductor device 110 also includes plug implant 122. Without the plug implant 122, the conductor 116 would contact not only the active region 120, but also the lightly doped region 114. The plug implant 122 buffers the lightly doped region 114 from the conductor 116 in the contact hole 118. As a result, the active region 120 is not shorted to the lightly doped portion 114 of the substrate 111.

Although plug implants 122 function for isolation structures 112 formed using LOCOS, the plug implants 122 provide little benefit in semiconductor devices having STI isolation structures 40. The sidewalls of the trenches 26 formed in STI have substantially vertical sidewalls, making implanting of plug implants virtually impossible.

The present invention mitigates the effects of misalignment of features, such as contact misalignment. The present invention provides a method and system for providing at least one feature on a semiconductor. The semiconductor includes a plurality of isolation structures. The method and system comprise providing an etch-stop layer over the semiconductor, providing a dielectric layer over the etch-stop layer, and etching through the dielectric layer and a portion of the etch-stop layer. A portion of the semiconductor adjacent to one of the plurality of isolation structures is not exposed during the etch.

Figure 4:
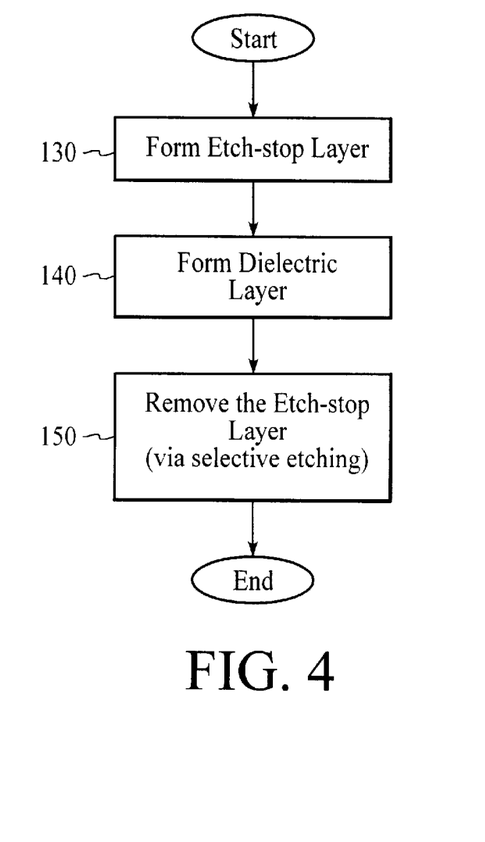
FIG. 4 is a high level flow chart illustrating fabrication of a semiconductor device using STI with the etch-stop layer according with the present invention.

To more particularly illustrate the method and system in accordance with the present invention refer to FIG. 4. FIG. 4 depicts a high level flow chart of a method in accordance with the present invention. An etch-stop layer is formed via step 130. The dielectric layer, such as a BPSG layer, is then formed above the etch-stop layer via step 140. The after formation of the feature, such as the contact holes, not shown, the etch-stop layer is removed via step 150. In a preferred embodiment, the etch which removes the etch-stop layer is highly selective, removing the etch-stop layer at a much higher rate than the dielectric in the STI isolation structures.

Figure 5:
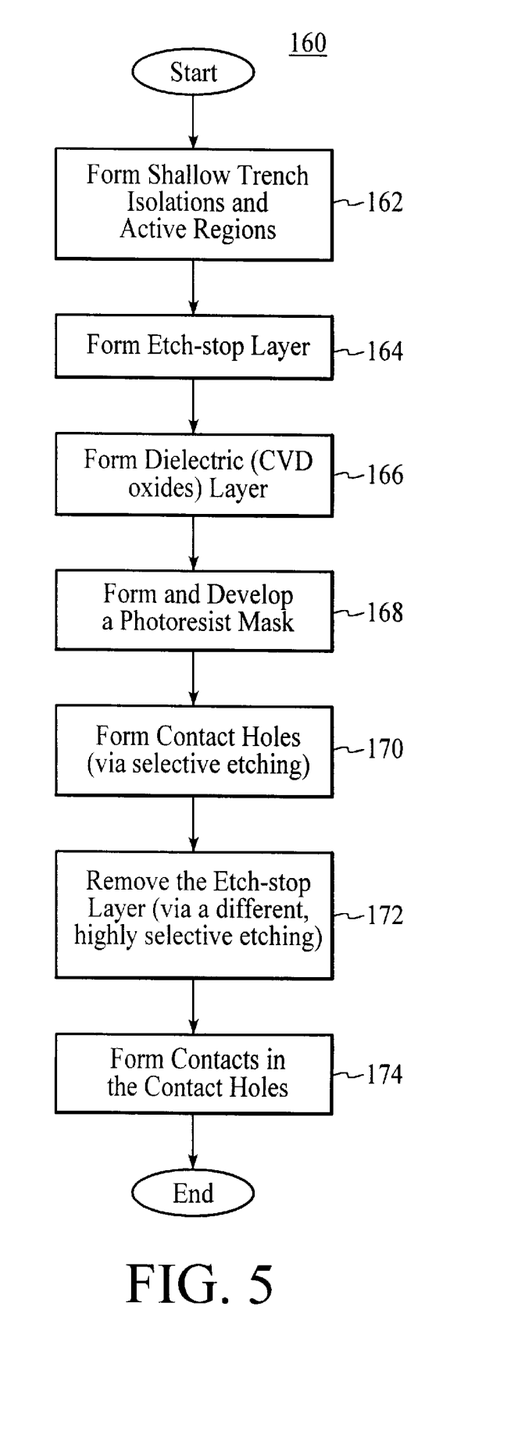
FIG. 5 is a flow chart illustrating in greater particularity the fabrication of a semiconductor device using STI with the etch-stop layer according with the present invention.

FIG. 5 depicts a more detailed flow chart of a method 160 for forming contact holes in accordance with the method and system. The isolation structures and active regions are formed via step 162. In a preferred embodiment, the isolation structures are STI isolation structures formed using conventional processing.

The etch-stop layer is then provided via step 164. In a preferred embodiment, the etch-stop layer is a nitride film or combination of high temperature oxide (HTO) and nitride which reacts with the etch chemistry in a substantially different manner than at least layers immediately above or below the etch-stop layer. In a preferred embodiment, the etch-stop layer etches substantially more slowly than the layer above the etch-stop layer. In one embodiment, the etch-stop layer etches at least as fast as a portion of the layer below the etch-stop layer. In a preferred embodiment, the etch-stop layer etches faster than the layer below the etch-stop layer. Thus, the etch-stop layer etches more quickly than the dielectric in the STI isolation structures below the etch stop layer. In a preferred embodiment, the ratio of the etch rate for the etch-stop layer to the etch rate of the dielectric in the STI isolation structures may be two to one or more. This ratio allows for removal of the etch-stop layer without substantial damage to the underlying STI isolation structures.

The dielectric layer is then provided via step 166. In a preferred embodiment, the dielectric layer is a BPSG layer. A mask is then provided via step 168. The mask defines the placement of contact holes. The contact holes are then etched via step 170. The etch stop layer is then removed via step 172. The contact holes are then filled with a conductive material to form the contacts ia step 174.

Because of the etch chemistry of the etch-stop layer, the dielectric layer etches much more quickly than the etch-stop layer. In a preferred embodiment, the ratio of the etch rate for the dielectric layer to the etch rate of the etch-stop layer may be ten to one or more. An etch chemistry that could function in this manner is, for example, $CuF_8$, $C_2F_6$, CO etch chemistry. This ratio allows for etching of the features such as contact holes in the dielectric layer without removal of the etch-stop layer. Consequently, the underlying STI isolation structures are not damaged during etching of contact holes. Moreover, the difference in etch rates between the etch-stop layer and the dielectric in the STI isolation structures allows the etch-stop layer to be removed without substantial damage to the STI isolation structures.

Figure 6A:
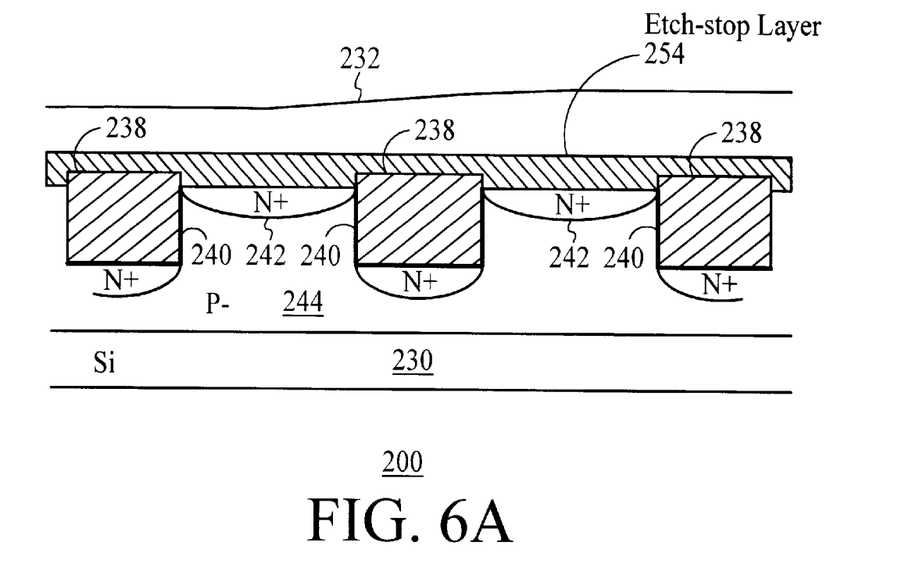
FIG. 6A illustrate formation contacts on a semiconductor device using STI in accordance with the present invention prior to providing the mask defining the contacts.

FIGS. 6A through 6D depict a system 200 during various steps in the method 160 where the mask formed in step 168 is misaligned. FIG. 6A depicts the system 200 after the dielectric layer has been provided in step 166. The system includes the semiconductor 230 having a lightly doped region 244. In a preferred embodiment, the lightly doped region 244 is p doped. The system 200 also includes active regions 242 separated by STI isolation structures 240 having dielectric 238. The etch-stop layer 254 is formed above the active regions 242 and the STI isolation structures 240. The dielectric layer 232 is formed on the etch stop layer. The thickness of the dielectric layer 232 varies across the surface of the semiconductor 230.

Figure 6B:
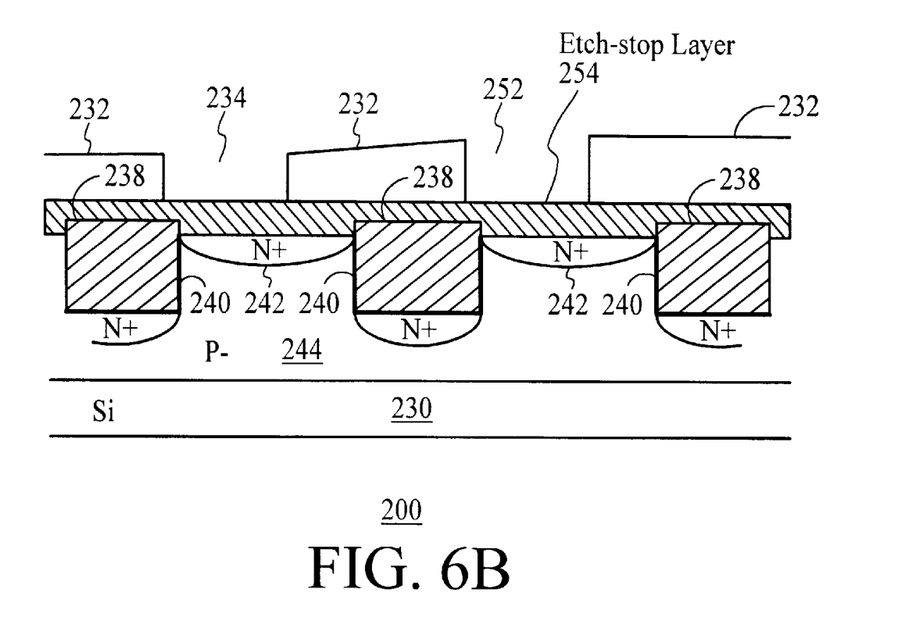
FIG. 6B illustrate one step in forming contacts on a semiconductor device using STI in accordance with the present invention after the dielectric is etched and where the mask defining the contacts is misaligned.

FIG. 6B depicts the system 200 after the contact holes have been etched via step 170. The mask defining the contact holes was misaligned. Consequently, a portion of contact holes 234 and 252 are above STI isolation structures 240. Because the dielectric layer 232 is thicker near the contact hole 252, the etch provided via step 110 must be sufficient to etch through this portion of the dielectric layer 232. Because the dielectric layer 232 is thinner near the contact hole 234, the dielectric layer 232 was etched longer than necessary to open this contact hole 234. However, because of the presence of the etch-stop layer 254, the contact hole etch does not damage the dielectric 238 in the STI isolation structures 240.

Figure 6C:
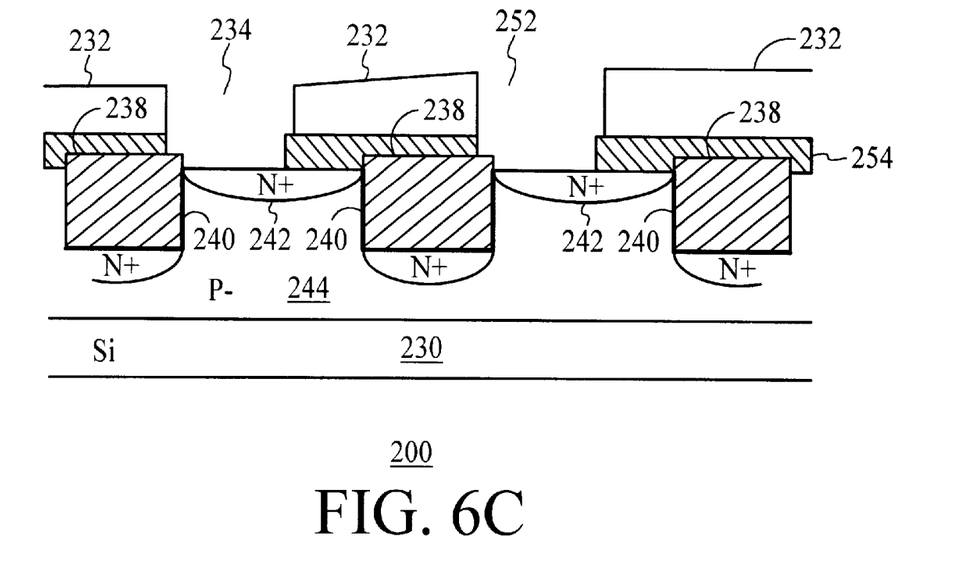
FIG. 6C illustrate one step in forming contacts on a semiconductor device using STI in accordance with the present invention after the etch stop layer is etched where the mask defining the contacts is misaligned.

FIG. 6C depicts the system 100 after removal of the etch-stop layer 254. Because the etch-stop layer 254 has an etch rate different from the etch rate of the dielectric 238 in the STI isolation structures 240, the dielectric 238 is not substantially damaged during removal of the etch-stop layer. A portion of the semiconductor 230 adjacent to the STI isolation structures 240 is not exposed. In other words, no portion of the lightly doped region 244 of the underlying semiconductor 230 is exposed by either the contact hole etch or the removal of the etch-stop layer.

Figure 6D:
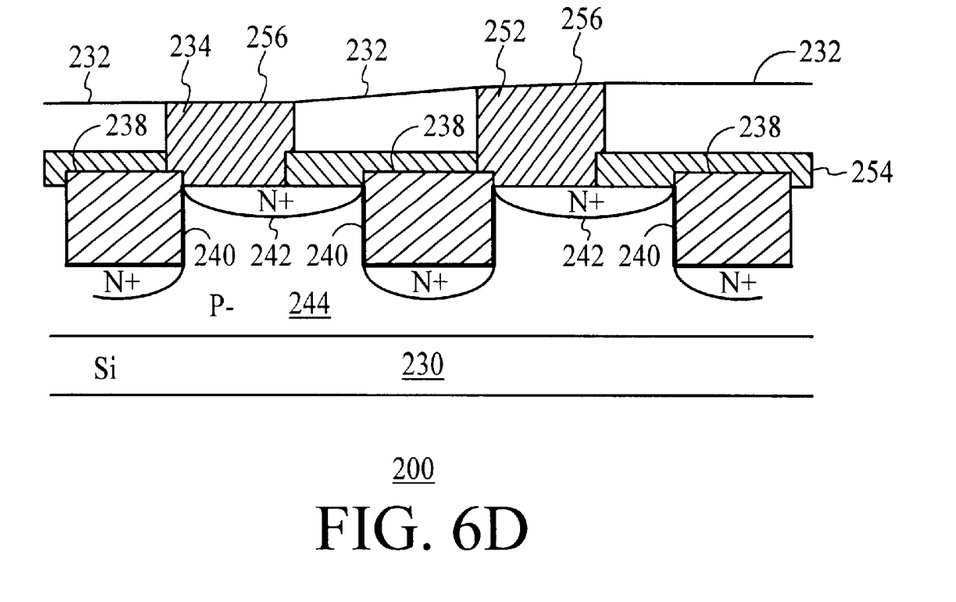
FIG. 6D illustrate one step in forming contacts on a semiconductor device using STI in accordance with the present invention after the contact holes are filled and where the mask defining the contacts is misaligned.

FIG. 6D depicts the system 100 after the contact holes 134 and 152 have been filled with a conductor 156. In a preferred embodiment, the conductor 156 is a metal. No portion of the semiconductor 130 other than active regions 242 was exposed by the formation of the contact holes 234 and 256. Consequently, the conductor 256 does not make contact with the lightly doped portion 244 of the underlying semiconductor. Shorting between the active regions 242 and the lightly doped region 244 of the semiconductor 230 is thereby precluded.

A method and system for mitigating the effects of misalignment of features in a semiconductor device have been disclosed. Through the use of an etch-stop layer in combination with a selective etching process the problems associated with contacts misalignment are substantially reduced.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing at least one contact on a semiconductor including a plurality of isolation structures, the method comprising the steps of:
   (a) providing an etch-stop layer in direct contact with the semiconductor;
   (b) providing a dielectric layer over the etch-stop layer; and
   (c) etching through the dielectric layer and a portion of the etch-stop layer, wherein a portion of the semiconductor in proximity with one of the plurality of isolation structures is not exposed during the etch.

2. The method of claim 1 wherein isolation structures are formed utilizing a LOCOS process.

3. The method of claim 1 wherein the plurality of isolation structures are formed utilizing a shallow trench isolation (STI) process.

4. The method of claim 1, wherein the at least one contact comprises a plurality of contacts.

5. The method of claim 4, wherein the etching step (c) further includes the step of:
   (c1) forming a plurality of contact holes corresponding to the plurality of contacts;
the method of claim 3 further including the step of:
   (d) providing a conductive filler for each of the plurality of contact holes.

6. The method of claim 5, wherein the etching step (c) further includes the steps of:
   (c2) providing a fast-rate etch, and
   (c3) providing a slow-rate etch.

7. The method of claim 6, wherein
   the etch stop layer has a first etch rate;
   the dielectric layer has a second etch rate; and
   the fast-rate etch step (c2) proceeds at the first etch rate; and wherein the slow-rate etch step (c3) proceeds at the second etch rate.

8. The method of claim 7, wherein the etch step (c) further includes an etch chemistry, the second etch rate being substantially greater than the first etch rate for the etch chemistry.

9. The method of claim 7, wherein at each of the plurality of contact holes the fast-rate etch step (c2) ends and the slow-rate etch step (c3) begins once the etch-stop layer is exposed.

10. The method of claim 7, wherein the etch step (c) includes an etch-rate ratio.

11. The method of claim 10, wherein the etch-rate ratio equals the first etch rate divided by the second etch rate.

12. The method of claim 11, wherein the etching-rate ratio is at least one to ten (1:10) such that the first etch rate is no more than one tenth (0.1) of the second etch rate.

13. The method of claim 8, further comprising the step of:
   (e) etching the etch-stop layer in proximity with one of the plurality of isolation structures.

14. The method of claim 13 wherein the etching the etch-stop layer step (e) further includes etching using a second etching chemistry; and wherein the etch-stop etches at a third etch rate for the second etch chemistry, the third etch rate being substantially different from a fourth etch rate of the isolation structure for the second etch chemistry.

15. The method of claim 14, wherein the etching the etch-stop layer step (e) further includes the steps of:
   (e1) providing a second fast-rate etching, and
   (e2) providing a second slow-rate etching.

16. The method of claim 15, wherein the second fast-rate etching step (e1) proceeds substantially at the third etching rate and while etching the etch-stop layer, and wherein the second slow-rate etching step (e2) proceeds substantially at the fourth etch rate during etching of the isolation structure.

17. The method of claim 1, wherein the material forming the etch-stop layer further comprises a nitride based film.

18. The method of claim 1 wherein the material forming the etch stop layer further comprises a combination of oxide and nitride based films.

19. The method of claim 18 wherein the combination of oxide and nitride films comprises SiOn.

20. The method of claim 15, wherein the etching of the etch-stop layer step (e) corresponds to a second etch-rate ratio.

21. The method of claim 20, wherein the etch-rate ratio is the third etch rate divided by the fourth rate.

22. The method of claim 20, wherein the etch-rate ratio is at least two to one (2:1) such that the third etching rate is at least two times the fourth etching.

23. The method of claim 4, wherein each of the plurality of contact holes has a depth, and wherein during the contact holes forming step the etching varies in duration among the plurality of contact holes based upon the depth.

24. The method of claim 1, wherein the portion of the semiconductor in proximity with one of the plurality of isolation structures not exposed during the etch further includes a lightly doped region.

25. The method of claim 24, wherein the lightly doped region further includes a lightly p-doped region.

* * * * *